(12) United States Patent
Konno

(10) Patent No.: US 11,128,312 B2
(45) Date of Patent: Sep. 21, 2021

(54) SUCCESSIVE APPROXIMATION AD CONVERTER

(71) Applicant: Asahi Kasei Microdevices Corporation, Tokyo (JP)

(72) Inventor: Shota Konno, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 17/027,715

(22) Filed: Sep. 22, 2020

(65) Prior Publication Data

US 2021/0091780 A1 Mar. 25, 2021

(30) Foreign Application Priority Data

Sep. 25, 2019 (JP) .............................. JP2019-174791

(51) Int. Cl.
*H03M 1/38* (2006.01)
*H03M 1/46* (2006.01)

(52) U.S. Cl.
CPC .................................. *H03M 1/462* (2013.01)

(58) Field of Classification Search
CPC ...... H03M 1/468; H03M 1/466; H03M 1/462; H03M 1/46; H03M 1/12; H03M 1/38; H03M 1/804; H03M 1/1245; H03M 1/145; H03M 1/68; H03M 1/00; H03M 1/002; H03M 1/123; H03M 1/125; H03M 1/001; H03M 1/56; H03M 1/0607; H03M 1/0617; H03M 1/1009; H03M 1/1028; H03M 1/06; H03M 1/0673

USPC .................. 341/118–121, 155, 172, 161
See application file for complete search history.

(56) References Cited

U.S. PATENT DOCUMENTS

| | | | |
|---|---|---|---|
| 7,286,075 B2 | 10/2007 | Hennessy et al. | |
| 7,663,518 B2 | 2/2010 | Hurrell | |
| 2010/0079325 A1* | 4/2010 | Berens | H03M 1/007 341/145 |
| 2010/0109924 A1* | 5/2010 | Cho | H03M 1/0695 341/118 |
| 2012/0112938 A1* | 5/2012 | Haneda | H03M 1/1019 341/110 |

(Continued)

FOREIGN PATENT DOCUMENTS

JP 4875099 2/2012

*Primary Examiner* — Linh V Nguyen
(74) *Attorney, Agent, or Firm* — JCIPRNET

(57) ABSTRACT

A successive approximation analog-digital (AD) converter and method performed by the converter are provided. The successive approximation AD converter comprises a digital-analog (DA) converter; a comparator which determines a magnitude relation between an input signal and an output signal of the DA converter; and a successive approximation register which generates a first digital signal based on a determination result. The method comprises: switching an operation selection signal from a first logic to a second logic; performing a logical operation so that a digital signal input to the DA converter has a larger value or a smaller value than the first digital signal, when the operation selection signal has transited to the second logic, based on a portion of the determined first digital signal until transition; and inputting the first digital signal to the DA converter when the operation selection signal is the first logic.

8 Claims, 15 Drawing Sheets

(56) References Cited

U.S. PATENT DOCUMENTS

| | | | |
|---|---|---|---|
| 2012/0182166 A1* | 7/2012 | Haneda | H03M 1/1061 |
| | | | 341/118 |
| 2012/0212357 A1* | 8/2012 | Haneda | H03M 1/066 |
| | | | 341/110 |
| 2014/0184432 A1* | 7/2014 | Huang | H03M 1/1057 |
| | | | 341/110 |
| 2014/0191889 A1* | 7/2014 | Haneda | H03M 1/069 |
| | | | 341/118 |
| 2015/0162933 A1* | 6/2015 | Girardi | H03M 1/0845 |
| | | | 341/145 |
| 2017/0012636 A1* | 1/2017 | Venca | H03M 1/1245 |
| 2017/0012638 A1* | 1/2017 | Furuta | H04B 1/16 |

* cited by examiner

When shift enable signal E_SFT = L

ADC operation: Fourth determination → DAC state after fourth determination → Code shift condition determination / Switching instruction to each DAC → DAC state of fifth determination (redundancy determination) → Fifth determination (redundancy determination)

Case classification of code shift determination by middle-order DAC control signal

| | | | | |
|---|---|---|---|---|
| DAC output value | 18 | ⇒ | 20 | 21 or 19 |
| | $18 = 1 \times 2^4 + 1 \times 2^1$ | | $20 = 1 \times 2^4 + 1 \times 2^1 + 1 \times 2^1$ | |
| High-order DAC control code | 10 | No change | 10 | 10 |
| Middle-order DAC control code | 01 | No change | 01 | 01 |
| Redundant DAC control code | 0 | Adding +1 to redundancy | 1 | 1 or 0 |
| Low-order DAC control code | 0 | — | 0 | 1 |

| | | | | |
|---|---|---|---|---|
| DAC output value | 16 | ⇒ | 16 | 17 or 15 |
| | $16 = 1 \times 2^4$ | | $16 = 1 \times 2^4$ | |
| High-order DAC control code | 10 | No change | 10 | 10 |
| Middle-order DAC control code | 00 | No change | 00 | 00 |
| Redundant DAC control code | 0 | No change | 0 | 0 or −1 |
| Low-order DAC control code | 0 | — | 0 | 1 |

| | | | | |
|---|---|---|---|---|
| DAC output value | 14 | ⇒ | 16 | 17 or 15 |
| | $14 = 1 \times 2^3 + 1 \times 2^2 + 1 \times 2^1$ | | $16 = 1 \times 2^3 + 1 \times 2^2 + 1 \times 2^1 + 1 \times 2^1$ | |
| High-order DAC control code | 01 | No change | 01 | 01 |
| Middle-order DAC control code | 11 | No change | 11 | 11 |
| Redundant DAC control code | 0 | Adding +1 to redundancy | 1 | 1 or 0 |
| Low-order DAC control code | 0 | — | 0 | 1 |

| | | | | |
|---|---|---|---|---|
| DAC output value | 12 | ⇒ | 12 | 13 or 11 |
| | $12 = 1 \times 2^3 + 1 \times 2^2$ | | $12 = 1 \times 2^3 + 1 \times 2^2$ | |
| High-order DAC control code | 01 | No change | 01 | 01 |
| Middle-order DAC control code | 10 | No change | 10 | 10 |
| Redundant DAC control code | 0 | No change | 0 | 0 or −1 |
| Low-order DAC control code | 0 | — | 0 | 1 |

FIG. 6B

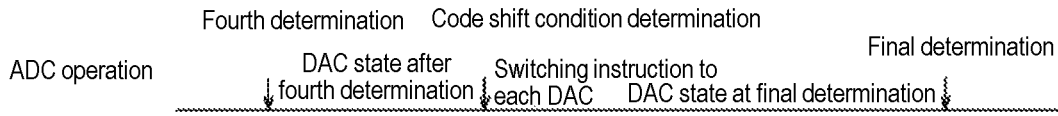

When shift enable signal E_SFT = H

ADC operation | Fourth determination | Code shift condition determination | Final determination
DAC state after fourth determination | Switching instruction to each DAC | DAC state at final determination Case classification of code shift determination by middle-order DAC control signal

| | | | | |
|---|---|---|---|---|
| DAC output value | 19 | ⇒ | 19 | 19 or 18 |
| | 19=1×2⁴+1×2¹+1 | | 19=1×2⁴+1×2¹+1 | |
| High-order DAC control code | 10 | No change | 10 | 10 |
| Low-order DAC control code (middle-order bit) | 01 | No change | 01 | 01 |
| Low-order DAC control code (low-order bit) | 1 | — | 1 | 1 or 0 |

| | | | | |
|---|---|---|---|---|
| DAC output value | 17 | ⇒ | 15 | 15 or 14 |
| | 17=1×2⁴+1 | | 15=1×2³+1×2²+1×2¹+1 | |
| High-order DAC control code | 10 | Shift to negative Inversion | 01 | 01 |
| Low-order DAC control code (middle-order bit) | 00 | | 11 | 11 |
| Low-order DAC control code (low-order bit) | 1 | — | 1 | 1 or 0 |

| | | | | |
|---|---|---|---|---|
| DAC output value | 15 | ⇒ | 17 | 17 or 16 |
| | 15=1×2³+1×2²+1×2¹+1 | | 17=1×2⁴+1 | |
| High-order DAC control code | 01 | Shift to negative Inversion | 10 | 10 |
| Low-order DAC control code (middle-order bit) | 11 | | 00 | 00 |
| Low-order DAC control code (low-order bit) | 1 | — | 1 | 1 or 0 |

| | | | | |
|---|---|---|---|---|
| DAC output value | 13 | ⇒ | 13 | 13 or 12 |
| | 13=1×2³+1×2²+1 | | 13=1×2³+1×2²+1 | |
| High-order DAC control code | 01 | No change | 01 | 01 |
| Low-order DAC control code (middle-order bit) | 10 | No change | 10 | 10 |
| Low-order DAC control code (low-order bit) | 1 | — | 1 | 1 or 0 |

FIG. 11A

| When shift enable signal E_SFT =L |
|---|

ADC operation | Fourth determination | Final determination
DAC state after fourth determination

Case classification of code shift determination by middle-order DAC control signal

| | | | |
|---|---|---|---|
| DAC output value | 19 | ⇒ | 19 or 18 |
| | $19 = 1 \times 2^4 + 1 \times 2^1 + 1$ | | |
| High-order DAC control code | 10 | | 10 |
| Low-order DAC control code (middle-order bit) | 01 | | 01 |
| Low-order DAC control code (low-order bit) | 1 | | 1 or 0 |

| | | | |
|---|---|---|---|
| DAC output value | 17 | ⇒ | 17 or 16 |
| | $17 = 1 \times 2^4 + 1$ | | |
| High-order DAC control code | 10 | | 10 |
| Low-order DAC control code (middle-order bit) | 00 | | 00 |
| Low-order DAC control code (low-order bit) | 1 | | 1 or 0 |

| | | | |
|---|---|---|---|
| DAC output value | 15 | ⇒ | 15 or 14 |
| | $15 = 1 \times 2^3 + 1 \times 2^2 + 1 \times 2^1 + 1$ | | |
| High-order DAC control code | 01 | | 01 |
| Low-order DAC control code (middle-order bit) | 11 | | 11 |
| Low-order DAC control code (low-order bit) | 1 | | 1 or 0 |

| | | | |
|---|---|---|---|
| DAC output value | 13 | ⇒ | 13 or 12 |
| | $13 = 1 \times 2^3 + 1 \times 2^2 + 1$ | | |
| High-order DAC control code | 01 | | 01 |
| Low-order DAC control code (middle-order bit) | 10 | | 10 |
| Low-order DAC control code (low-order bit) | 1 | | 1 or 0 |

FIG. 11B

SUCCESSIVE APPROXIMATION AD CONVERTER

CROSS REFERENCE TO RELATED APPLICATIONS

This application claims the priority benefit of Japanese Patent Application No. 2019-174791, filed on Sep. 25, 2019. The entirety of the above-mentioned patent application is hereby incorporated by reference herein and made a part of this specification.

BACKGROUND

Technical Field

The disclosure relates to a successive approximation analog-digital (AD) converter.

Description of Related Art

In realizing a high accuracy successive approximation analog-digital converter (hereinafter referred to as "successive approximation AD converter"), there are two major factors that cause a differential nonlinearity error. One is a static differential nonlinearity error caused by an element variation of a digital-analog converter (hereinafter referred to as "DA converter") that constitutes a successive approximation AD converter, and the other is a dynamic differential nonlinearity error due to a fact that the DA converter cannot converge on an originally expected analog value by the next determination point when the DA conversion is increased or decreased according to a successive approximation comparison.

The former static differential nonlinearity error occurs due to an element variation of a DA converter that constitutes a successive approximation AD converter. For example, in a 5-bit binary DA converter shown in FIG. 12, a most significant bit is expected to have a weight of 16 ideally, but this weight varies due to a manufacturing variation of an element.

As for the latter dynamic differential nonlinearity error, the characteristics can be improved by waiting a sufficient time, but this causes a problem in realizing further speedup. As a solution to this problem, it has been proposed in conventional technologies to introduce redundancy into a successive approximation AD converter. When redundancy is provided, patterns of digital codes representing a certain analog input value can overlap. Therefore, even when a mistake in determination on a high-order side occurs due to insufficient settling or the like, a DA conversion element on a low-order side of the bit can be represented by a different combination. Therefore, an erroneous determination on the high-order bit side can be corrected, and even when this causes insufficient settling, it can be realized without a final AD conversion result being affected.

Here, the reason why the static differential nonlinearity error is not improved even in a DA converter having general redundancy will be described. The static differential nonlinearity error is caused by inconsistency between an actual weight carried by each DA conversion element and a weight assumed in a digital output. In a determination sequence with general redundancy, an attempt is made to correct a conversion error generated in the high-order conversion by replacing an element of a redundant bit without replacing an element in which inconsistency has occurred. Therefore, the inconsistency may not be eliminated and the static differential nonlinearity error may not be improved.

For example, as shown in FIG. 13, the conventional technology described in Patent Document 1 (Japanese Patent No. 4875099) includes a DA converter used for a successive approximation AD conversion, and furthermore, a pseudo-random number generator and a DA converter in which a value of the pseudo-random number generator is reflected. Also, the conventional technology further includes a circuit which sums up a value of the pseudo-random signal and a value of the successive approximation conversion result using a digital circuit. Thereby, the conventional technology improves differential nonlinearity by intentionally shifting a code that disappears according to a value of the pseudo-random signal and temporally averaging AD conversion values obtained for each pseudo-random signal.

However, the conventional technology needs to include a circuit that generates a pseudo-random signal and a capacitor (DA converter) that applies the pseudo-random signal to make an improvement in the differential nonlinearity error, and thereby increases a circuit area thereof.

SUMMARY

The disclosure provides a successive approximation AD converter in which a differential nonlinearity error is improved with a small area even when there is a variation in an element constituting a DA converter.

A successive approximation analog-digital (AD) converter according to the disclosure includes a comparator circuit which determines a magnitude relation between an input analog signal and a reference signal, a successive approximation register which holds a result determined by the comparator circuit and generates a first digital signal including a first bit signal and a second bit signal, an arithmetic circuit to which the first digital signal is input and which generates a second digital signal including a third bit signal and a fourth bit signal, a first bit digital-analog (DA) converter which converts the third bit signal into a first analog signal; a second bit DA converter which converts the fourth bit signal into a second analog signal, a reference signal generation circuit which generates the reference signal based on the first analog signal and the second analog signal, and a switching signal generation circuit which generates an operation selection signal switching between a first state that a logical operation is not performed and a second state that a logical operation is performed. When the operation selection signal is in the second state, after completion of determination for the determination bit signal that is a portion of the second bit signal in the first state until the operation selection signals transit to the second state, the arithmetic circuit generates the second digital signal to have a larger value or a smaller value than the input first digital signal based on any one of determination bit signals.

According to another embodiment of the disclosure, a successive approximation analog-digital (AD) conversion method for a successive approximation AD converter including a digital-analog (DA) converter, a comparator which determines a magnitude relation between an input signal and an output signal of the DA converter, and a successive approximation register which generates a first digital signal based on the determination result is provided. The successive approximation AD conversion method comprises switching an operation selection signal from a first logic to a second logic; performing a logical operation so that a digital signal input to the DA converter has a larger value or a smaller value than the first digital signal, when the operation selection signal has transited to the second logic, based on a portion of the determined first digital signal until transition; and inputting the first digital signal to the DA converter when the operation selection signal is the first logic.

BRIEF DESCRIPTION OF THE DRAWINGS

FIG. 6B is a diagram showing a change in DAC control codes according to a code shift condition determination when the shift enable signal E_SFT is L in the successive approximation AD converter shown in FIG. 3.

FIG. 11A is a diagram showing a change in DAC control codes according to a code shift condition determination when the shift enable signal E_SFT is H in the successive approximation AD converter shown in FIG. 1.

FIG. 11B is a diagram showing a change in DAC control codes according to a code shift condition determination when the shift enable signal E_SFT is L in the successive approximation AD converter shown in FIG. 1.

DESCRIPTION OF THE EMBODIMENTS

Figure 1:
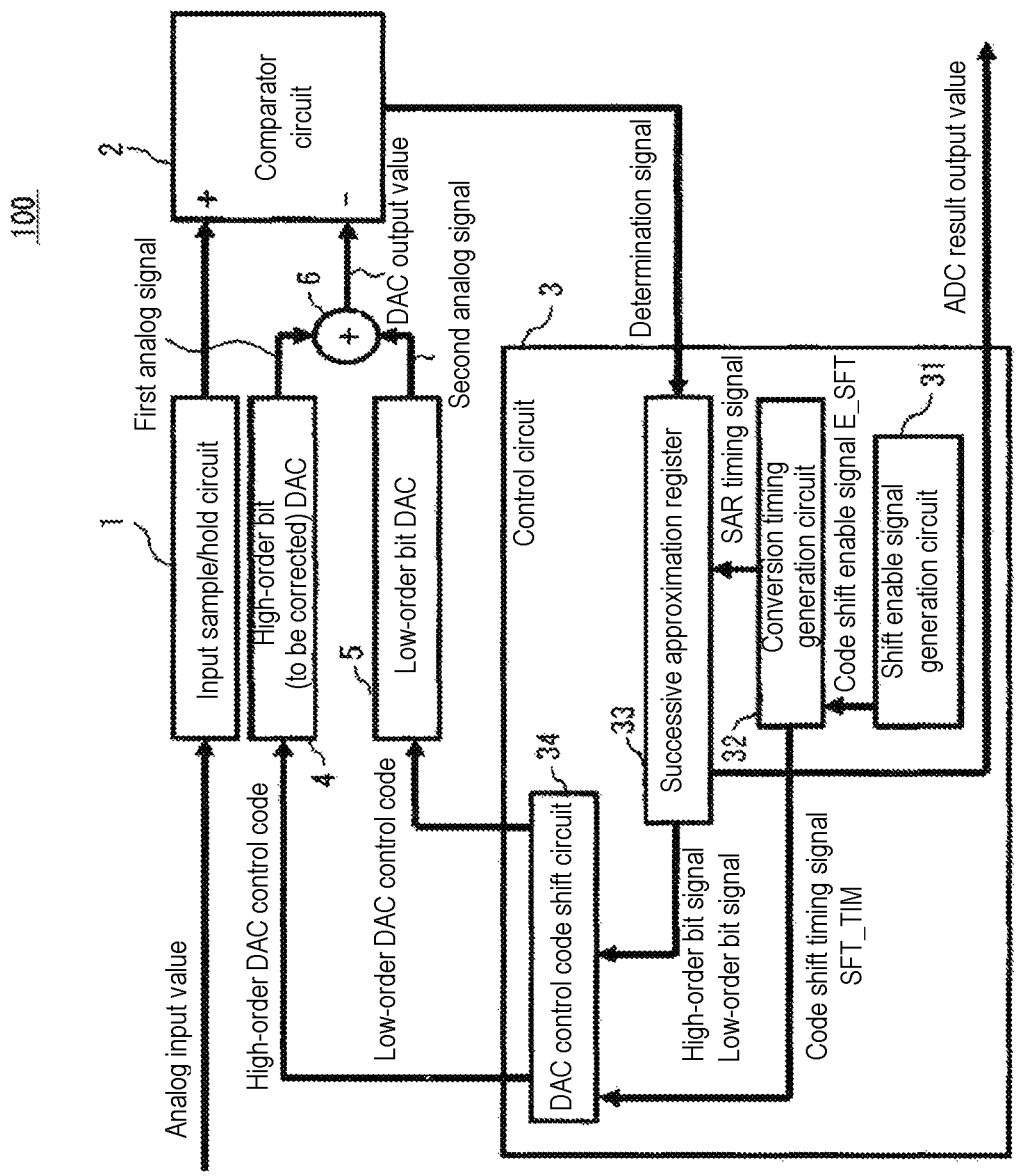
FIG. 1 is a block diagram showing a configuration example of a successive approximation AD converter according to the present embodiment.

Embodiments of the disclosure will be described in detail with reference to the drawings. In the drawings, analog-digital (AD) conversion and digital-analog (DA) conversion may be referred to as ADC and DAC.

FIG. 1 is an overall schematic configuration view of a successive approximation AD converter 100 according to the present embodiment. The successive approximation AD converter 100 shown in FIG. 1 includes an input sample/hold circuit 1, a comparator circuit 2, a control circuit 3, a first bit DA converter (high-order bit (that is to be corrected) digital-analog converter (hereinafter referred to as "high-order bit DAC")) 4, a second bit DA converter (low-order bit digital-analog converter (hereinafter referred to as "low-order bit DAC")) 5, and a reference signal generation circuit 6.

The input sample/hold circuit 1 samples and holds an input analog signal.

The comparator circuit 2 determines a magnitude relation between an input analog signal held in the input sample/hold circuit 1 and a reference signal. Also, the comparator circuit 2 generates a determination signal based on a determination. The reference signal is a signal generated by the reference signal generation circuit 6 to be described below in detail based on a first analog signal and a second analog signal.

The control circuit 3 includes a shift enable signal generation circuit 31, a conversion timing generation circuit 32, a successive approximation register 33, and an arithmetic circuit (digital-analog conversion control code shift circuit (hereinafter referred to as "DAC control code shift circuit")) 34.

The shift enable signal generation circuit 31 generates a code shift enable signal E_SFT to the conversion timing generation circuit 32 at a predetermined timing.

The switching signal generation circuit (hereinafter referred to as "conversion timing generation circuit") 32 generates an operation selection signal (hereinafter referred to as "code shift timing signal") SFT_TIM to the DAC control code shift circuit 34 according to a polarity of the code shift enable signal E_SFT generated by the shift enable signal generation circuit 31. The code shift timing signal SFT_TIM has one of a first logical value (hereinafter referred to as "H") and a second logical value (hereinafter referred to as "L"), and the conversion timing generation circuit 32 sets the code shift timing signal SFT_TIM to "L" by a certain timing during successive approximation and sets the code shift timing signal SFT_TIM to "H" when the determination sequence ends. Also, the conversion timing generation circuit 32 generates a successive approximation register (SAR) timing signal to the successive approximation register 33. A first state represents that the operation selection signal does not transit and remains unchanged from the first logic value, and a second state represents that the operation selection signal transits from the first logic value to the second logic value. That is, the switching signal generation circuit 32 generates the operation selection signal for switching between the first state that the logical operation is not performed and the second state that the logical operation is performed.

The successive approximation register 33 holds a determination result of the comparator circuit 2 which represents a determination signal generated by the comparator circuit 2, and generates a first digital signal including a first bit signal which is a signal of high-order bits (hereinafter referred to as "high-order bit signal") and a second bit signal which is a signal of a low-order bits (hereinafter referred to as "low-order bit signal"). The high-order bit signal includes bits having one or more digits (for example, two digits). The low-order bit signal includes a determination bit signal which is a middle-order bit signal (hereinafter referred to as "middle-order bit signal") and includes one or more digits (for example, three digits).

The DAC control code shift circuit 34 generates a third bit signal (hereinafter referred to as "high-order bit DAC control code") and a fourth bit signal (hereinafter referred to as "low-order bit DAC control code") based on the high-order bit signal and the low-order bit signal held in the successive approximation register 33. Also, the third bit signal and the fourth bit signal constitute a second digital signal. Specifically, the DAC control code shift circuit 34 generates the high-order bit DAC control code and the low-order bit DAC control code such that a signal including the high-order bit DAC control code and the low-order bit DAC control code has a larger value or a smaller value than a signal including the high-order bit signal and the low-order bit signal based on the middle-order bit signal which is determined as the middle-order bit signal among the low-order bit signals before the code shift timing signal SFT_TIM transits to H. The DAC control code shift circuit 34 is an arithmetic circuit to which the first digital signal is input and which generates the second digital signal.

More specifically, the DAC control code shift circuit 34 generates the high-order bit DAC control code and the low-order bit DAC control code such that the signal including the high-order bit DAC control code and the low-order bit DAC control code has a larger value or a smaller value than the signal including the high-order bit signal and the low-order bit signal based on the middle-order bit signal when the code shift timing signal SFT_TIM is H. That is, when the operation selection signal is in the second state, after completion of a determination for the determination bit signal of a portion of the second bit signal in the first state until the operation selection signal transits to the second state, the DAC control code shift circuit (the arithmetic circuit) 34 generates the second digital signal to have a larger value or a smaller value than the input first digital signal based on any one of determination bit signals. Also, when the code shift timing signal SFT_TIM is L, the DAC control code shift circuit 34 generates the high-order bit signal as the high-order bit DAC control code and generates the low-order bit signal as the low-order bit DAC control code.

When bit values of the middle-order bit signal are the same value, the DAC control code shift circuit 34 generates the high-order bit DAC control code and the low-order bit DAC control code (the second digital signal) so that the signal including the high-order bit DAC control code and the low-order bit DAC control code has a larger value or a smaller value than the signal (the input first digital signal) including the high-order bit signal and the low-order bit signal. Also, when bit values of the middle-order bit signal (determination bit signal) do not each have the same value, the DAC control code shift circuit 34 generates the high-order bit signal which is the first bit signal as the high-order bit DAC control code which is the third bit signal and generates the low-order bit signal which is the second bit signal as the low-order bit DAC control code which is the fourth bit signal.

When bit values of the middle-order bit signal are all 1, the DAC control code shift circuit 34 generates a signal obtained by incrementing the first digital signal including the high-order bit signal and the low-order bit signal as the second digital signal including the high-order bit DAC control code and the low-order bit DAC control code. Also, when the bit values of the high-order bit signal are all 0, the DAC control code shift circuit 34 generates a signal obtained by decrementing the first digital signal including the high-order bit signal and the low-order bit signal as the second digital signal including the high-order bit DAC control code and the low-order bit DAC control code.

Figure 2:
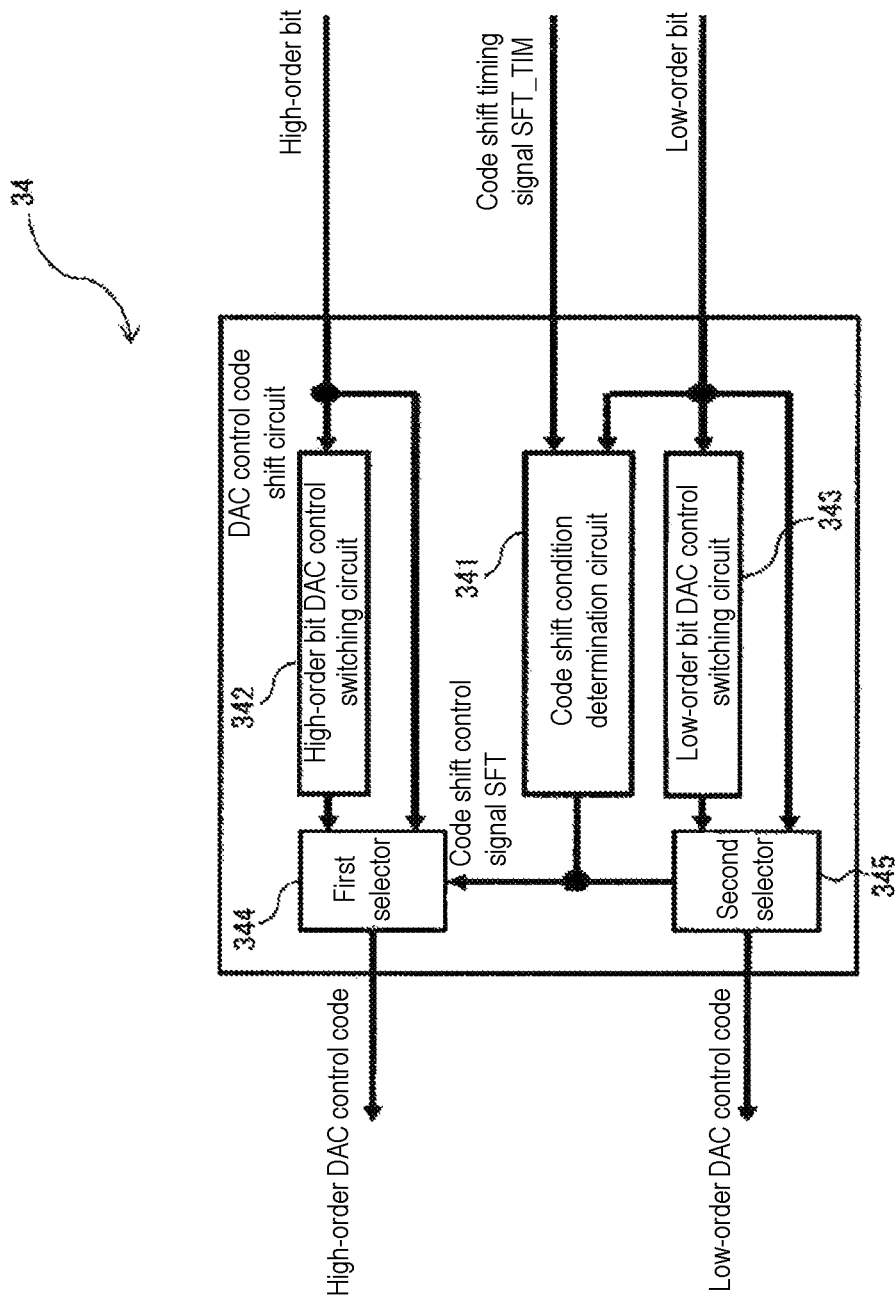
FIG. 2 is a block diagram showing a configuration example of a DAC control code shift circuit in the successive approximation AD converter shown in FIG. 1.

A configuration of the DAC control code shift circuit 34 will be described in detail with reference to FIG. 2. FIG. 2 is a block diagram of the DAC control code shift circuit 34. As shown in FIG. 2, the DAC control code shift circuit 34 includes a code shift condition determination circuit 341, a high-order bit digital-analog conversion control switching circuit (hereinafter referred to as "high-order bit DAC control switching circuit") 342, a low-order bit digital-analog conversion control switching circuit (hereinafter referred to as "low-order bit DAC control switching circuit") 343, a first selector 344, and a second selector 345.

The code shift condition determination circuit 341 generates a code shift control signal SFT so that the first selector 344 and the second selector 345 are switched according to the middle-order bit signal.

The high-order bit DAC control switching circuit 342 generates a high-order DAC control code in which the high-order bit signal is changed as will be described below.

The low-order bit DAC control switching circuit 343 generates a low-order DAC control code in which the low-order bit signal is changed as will be described below.

The first selector 344 generates the high-order bit signal changed by the high-order bit DAC control switching circuit 342 or the high-order bit signal generated from the successive approximation register 33 as the high-order DAC control code based on the code shift control signal SFT.

The second selector 345 generates the low-order bit signal changed by the low-order bit DAC control switching circuit 343 or the low-order bit signal generated from the successive approximation register 33 as the low-order DAC control code based on the code shift control signal SFT.

The high-order bit DAC 4 converts the high-order DAC control code into a first analog signal.

The low-order bit DAC 5 converts the low-order DAC control code into a second analog signal.

The reference signal generation circuit 6 generates a determination signal indicating a value obtained by adding the first analog signal converted by the high-order bit DAC 4 and the second analog signal converted by the low-order bit DAC 5 to the comparator circuit 2.

Figure 3:
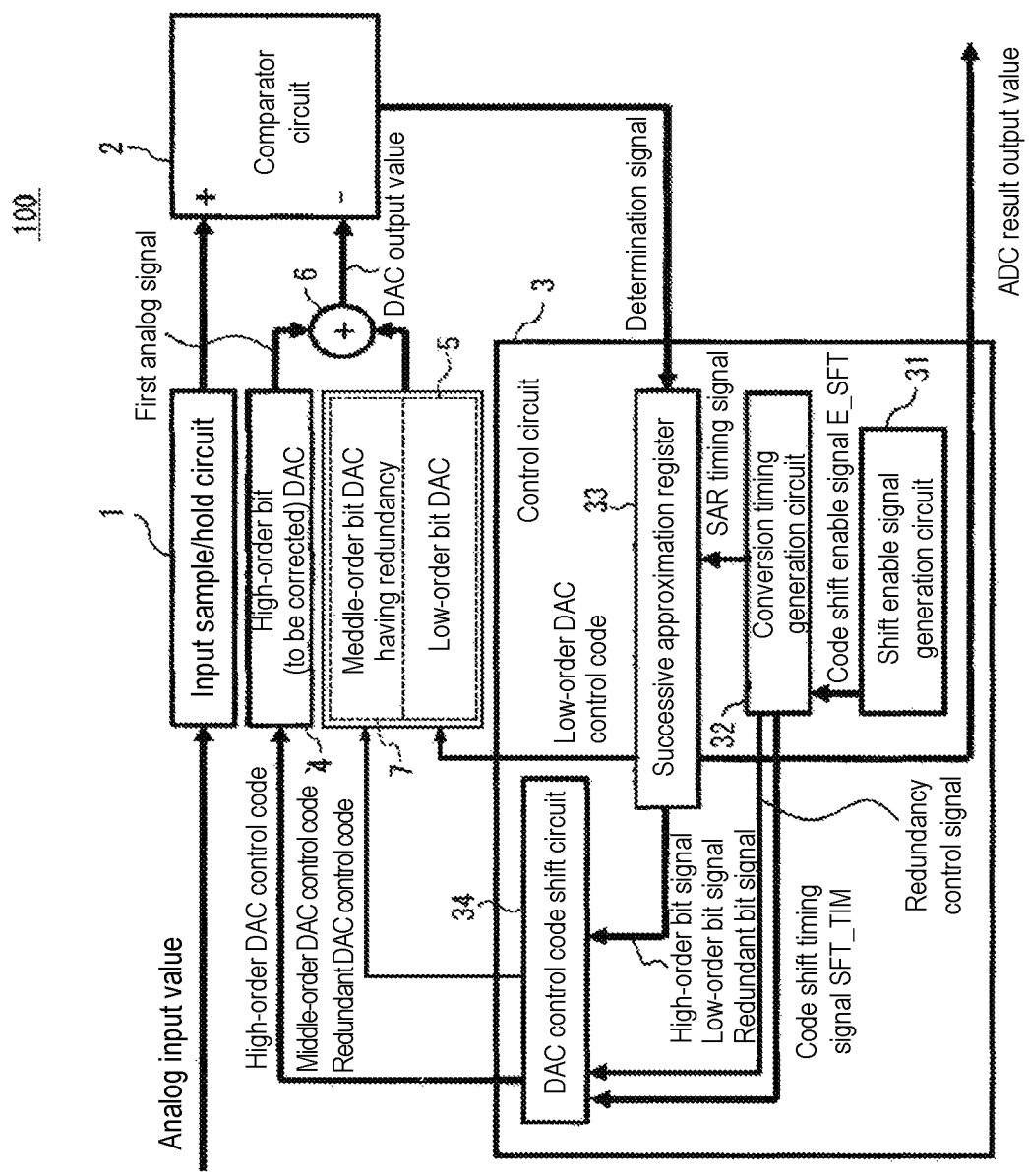
FIG. 3 is a block diagram showing another configuration example of the successive approximation AD converter according to the present embodiment.
Figure 4:
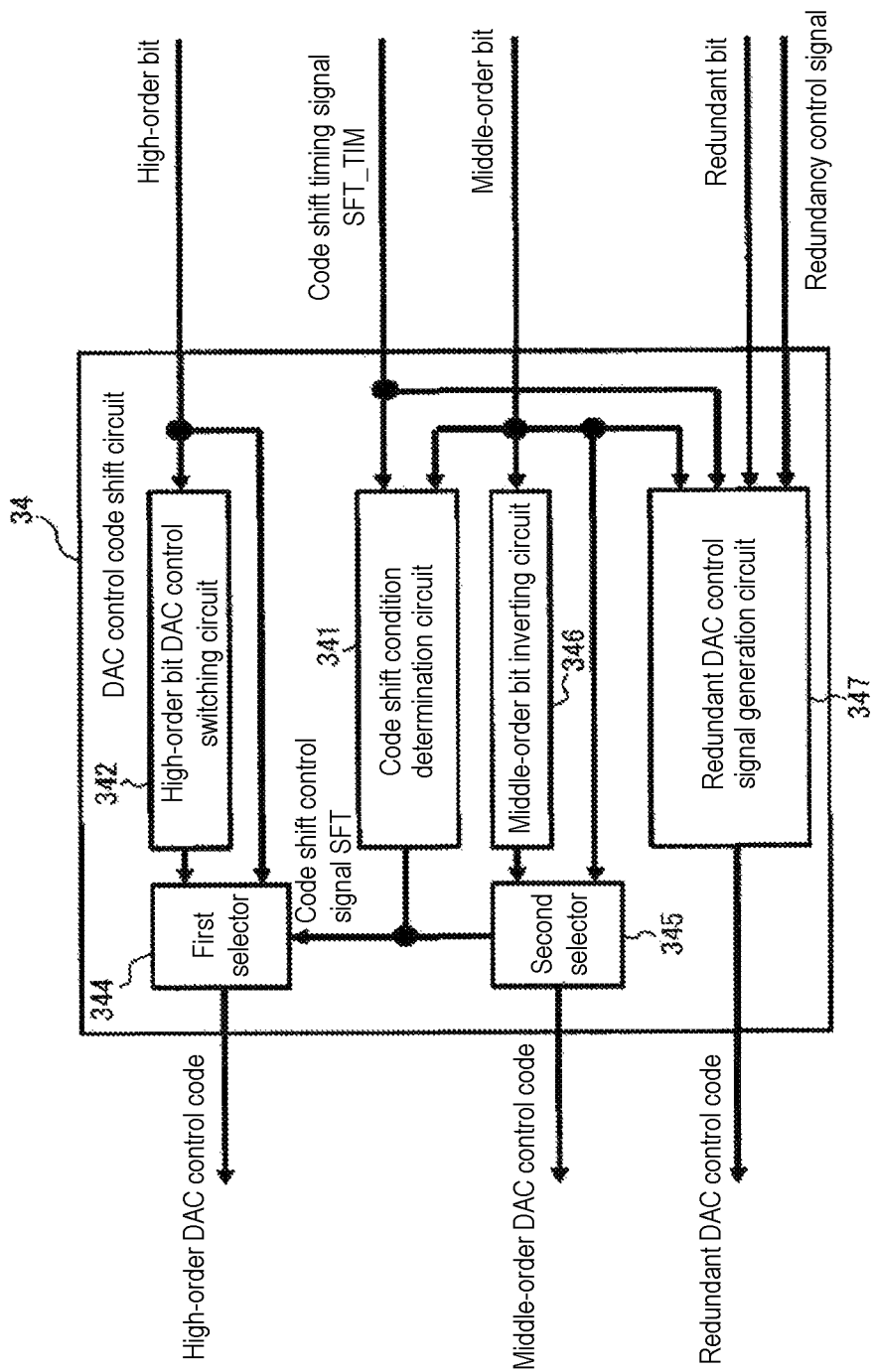
FIG. 4 is a block diagram showing a configuration example of a DAC control code shift circuit in the successive approximation AD converter shown in FIG. 3.

As shown in FIG. 3, the successive approximation AD converter 100 according to the present embodiment may further include a redundant bit DA converter (middle-order bit digital-analog converter (hereinafter referred to as "middle-order bit DAC having redundancy") 7. In this configuration, as shown in FIG. 4, the DAC control code shift circuit 34 includes a middle-order bit inverting circuit 346 and a redundant digital-analog converter control signal generation circuit (hereinafter referred to as "redundant DAC control signal generation circuit") 347 in place of the low-order bit DAC control switching circuit 343.

In this case, the conversion timing generation circuit 32 further generates a redundancy control signal to the DAC control code shift circuit 34 in addition to the code shift timing signal SFT_TIM. The successive approximation register 33 holds the high-order bit signal, the middle-order bit signal, and a first redundant bit signal (hereinafter referred to as "redundant bit signal") based on the determination signal, and generates them to the DAC control code shift circuit 34. Also, the successive approximation register 33 generates a low-order DAC control code to the low-order bit DAC 5 based on the determination signal.

The DAC control code shift circuit 34 generates the redundant bit signal as a second redundant bit signal (hereinafter referred to as "redundant DAC control code") based on the redundancy control signal.

The middle-order bit inverting circuit 346 generates a middle-order DAC control code obtained by inverting a polarity of the middle-order bit signal generated from the successive approximation register 33.

The redundant DAC control signal generation circuit 347 generates the redundant DAC control code based on the redundant bit signal generated from the successive approximation register 33 according to the redundancy control signal generated from the conversion timing generation circuit 32.

In such a configuration, the DAC control code shift circuit 34 generates the redundant DAC control code based on the redundant bit signal according to the redundancy control signal.

Specifically, when the code shift timing signal SFT_TIM is in the second state (H) while the redundancy control signal has the first logical value (H), and the bit values of the middle-order bit signal serving as the determination bit signal are all 1, the DAC control code shift circuit 34 generates the redundant bit signal as the redundant DAC control code. Also, when the code shift timing signal SFT_TIM is in the second state (H) while the redundancy control signal has the first logical value (H), and the bit values of the middle-order bit signal are all 0, the DAC control code shift circuit 34 generates a signal obtained by incrementing the first redundant bit signal as the redundant DAC control code. Also, when the code shift timing signal SFT_TIM is in the second state (H) while the redundancy control signal has the first logical value (H), and bit values of the middle-order bit signal do not all have the same value, the DAC control code shift circuit 34 generates a signal obtained by adding a least significant bit of the middle-order bit signal to the redundant bit signal as the redundant DAC control code. Also, when the code shift timing signal SFT_TIM is in the first state (L) while the redundancy control signal has the first logical value (H), the DAC control code shift circuit 34 generates a signal obtained by adding a least significant bit of the middle-order bit signal to the redundant bit signal as the redundant DAC control code. When the redundancy control signal has the second logical value (L), the redundant bit signal is generated as the redundant DAC control code.

A successive approximation AD conversion performed by the successive approximation AD converter 100 configured as described above using bits having redundancy will be described in detail below. Here, the processing of the successive approximation AD converter 100 in which the middle-order bit DAC 7 having redundancy is further included as shown in FIG. 3, and the DAC control code shift circuit 34 includes the middle-order bit inverting circuit 346 and the redundant DAC control signal generation circuit 347 as shown in FIG. 4 will be described, but the successive approximation AD converter 100 may not include the middle-order bit DAC 7 having redundancy, the middle-order bit inverting circuit 346, and the redundant DAC control signal generation circuit 347.

Figure 5:
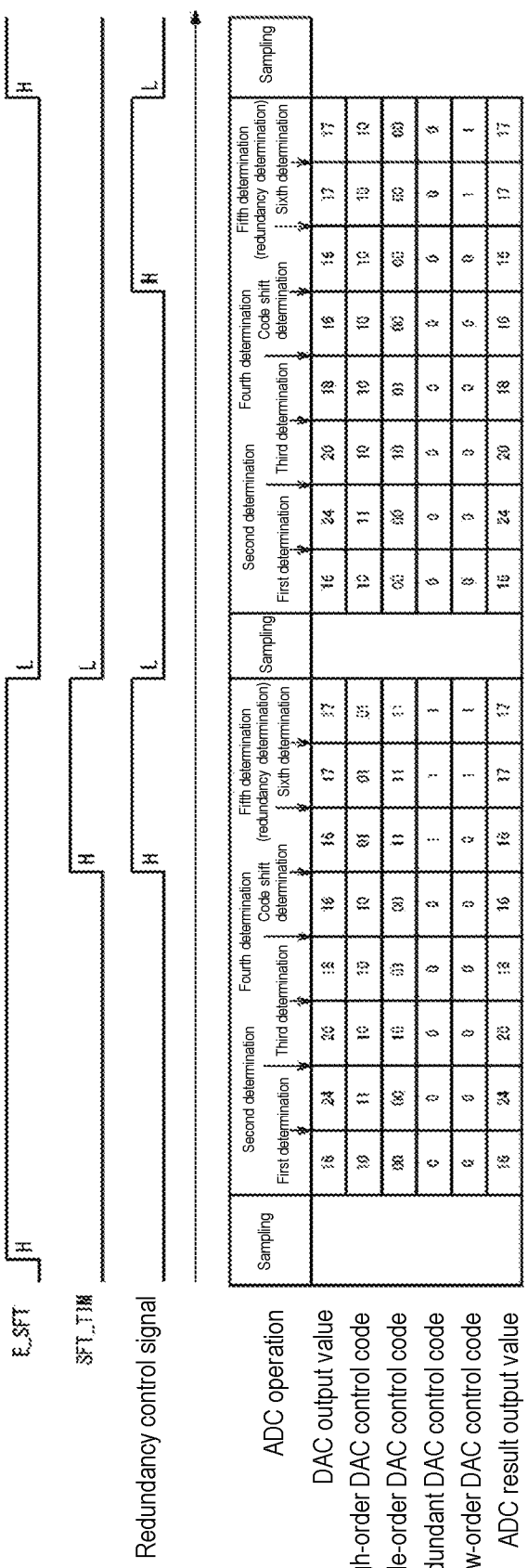
FIG. 5 is a timing chart of a successive approximation conversion when no element variation occurs in the successive approximation AD converter shown in FIG. 3.

FIG. 5 is a timing chart of a successive approximation conversion by the successive approximation AD converter 100 shown in FIGS. 3 and 4. As shown in FIG. 5, the conversion timing generation circuit 32 changes the code shift timing signal SFT_TIM according to a polarity of the code shift enable signal E_SFT generated by the shift enable signal generation circuit 31. Specifically, when the code shift enable signal E_SFT is H, the conversion timing generation circuit 32 changes the code shift timing signal SFT_TIM from "L" to "H" at a certain timing during the successive approximation conversion. When the code shift enable signal E_SFT is L, the conversion timing generation circuit 32 sets the code shift timing signal SFT_TIM to "L."

Further, in the example described with reference to FIG. 5, a digital value converted by the successive approximation AD converter 100 is a 5-bit digital value having a redundant bit. The redundant bit has the same weight as a fourth bit from a high-order bit and has a weight of 2. First, an operation in an ideal case in which there is no element variation occurring in the DA converter will be described.

<<When Code Shift Enable Signal is L>>

When the code shift enable signal E_SFT generated by the shift enable signal generation circuit 31 is L, the same conversion as a successive approximation conversion having general redundancy is performed.

<Sampling>

First, the input sample/hold circuit 1 samples an analog input value which is a value of an analog input signal.

<First Determination Sequence>

A determination sequence of each time is divided into [DAC setting] and [Determination (and reflection of determination result on DAC value)].

[DAC Setting]

Next, a DAC value for performing a first successive approximation determination is set. Specifically, a most significant bit, which is a first digit of high-order bits and has a weight of 16, is set to "1" and the other bits are set to "0." That is, the DAC value is set to "10000."

[Determination (and Reflection of Determination Result on DAC Value)]

The most significant bit is decided by the first successive approximation determination made by the comparator circuit 2. Specifically, the comparator circuit 2 generates a determination signal "1" when an analog input value sampled by the input sample/hold circuit 1 is equal to or higher than a DAC output value, and generates a determination signal "0" when the analog input value is less than the DAC output value. Thereby, the most significant bit is decided to be the value of the determination signal generated by the first determination. In the example of FIG. 5, since the analog input value is "17.5" and the DAC output value is "16," the comparator circuit 2 generates the determination signal "1" in the first determination. Thereby, the most significant bit is decided to be "1."

<Second Determination Sequence>

[DAC Setting]

A DAC value for performing a second successive approximation determination is set. Specifically, in the control circuit 3, the value of the determination signal generated by the first determination is set as the most significant bit, a second most significant bit which has a next largest weight after the most significant bit is set to 1, and the other bits are set to 0. That is, in the present example, the DAC value is set to "11000."

[Determination (and Reflection of Determination Result on DAC Value)]

The second most significant bit is decided by the second successive approximation determination made by the comparator circuit 2. Specifically, the comparator circuit 2 generates a determination signal "1" when the analog input value sampled by the input sample/hold circuit 1 is equal to or higher than a DAC output value, and generates a determination signal "0" when the analog input value is less than the DAC output value. Thereby, the second most significant bit is decided to be the value of the determination signal generated by the second determination. In the present example, since the analog input value is "17.5" and the DAC output value is "24," the comparator circuit 2 generates the determination signal "0" in the second determination. Thereby, the second most significant bit is decided to be "0."

In the same manner, the DAC setting and the determination are repeatedly performed up to a bit having the same weight as the weight of the redundant bit. In the present example, the DAC setting and the determination are repeatedly performed up to a fourth most significant bit having the same weight as the weight of the redundant bit.

<Fifth Redundant Bit Determination Sequence>

Here, since the code shift enable signal E_SFT is L, a determination of a general redundant bit is performed as shown in FIG. 6B.

[DAC Setting]

When the redundancy control signal generated from the conversion timing generation circuit 32 is switched from L to H, only the redundant DAC control code is changed. Specifically, when a determination signal "1" is generated by an immediately preceding determination (fourth determination in the present example) made by the comparator 2, the DAC control code shift circuit 34 generates a signal obtained by incrementing the redundant bit as the redundant DAC control code. When a determination signal "0" is generated by the immediately preceding determination (fourth determination in the present example) made by the comparator 2, the DAC control code shift circuit 34 generates the redundant bit as the redundant DAC control code.

[Determination (and Reflection of Determination Result on DAC Value)]

The redundant bit is decided by a fifth successive approximation determination made by the comparator 2. Specifically, the comparator 2 generates a determination signal "1" when the analog input value sampled by the input sample/hold circuit 1 is equal to or higher than a DAC output value, and generates a determination signal "0" when the analog input value is less than the DAC output value. The DAC control code shift circuit 34 does not change the redundant DAC control code when the determination signal "1" is generated. When the determination signal "0" is generated, the redundant DAC control signal generation circuit 347 of the DAC control code shift circuit 34 decrements the redundant DAC control code.

<Sixth Determination Sequence>

A fifth significant bit is decided by performing the DAC setting and the determination as in the first to fourth determination sequences described above.

The high-order DAC control code, the middle-order DAC control code and the redundant DAC control code, and the low-order DAC control code that are decided as above are generated, and an AD conversion result output value ("17" in the present example, as shown in FIG. 5) is generated based on the values each converted by the high-order bit DAC, the middle-order bit DAC, and the low-order bit DAC.

<<When the Code Shift Enable Signal is H>>

Next, the successive approximation conversion when the code shift enable signal E_SFT is H will be described.

When the code shift enable signal E_SFT is H, a sampling and first to fourth determination sequences are the same as the sampling and the first to fourth determination sequences when the code shift enable signal E_SFT is L. When the fourth determination sequence ends, a fifth redundant bit determination sequence according to the code shift condition determination is performed.

<Fifth Redundant Bit Determination Sequence>

Here, since the code shift enable signal E_SFT is H, the DAC control code shift circuit 34 generates the high-order DAC control code, the middle-order DAC control code, and the redundant DAC control code according to the result of the code shift condition determination.

[Code Shift Condition Determination and DAC Setting]

Figure 6A:
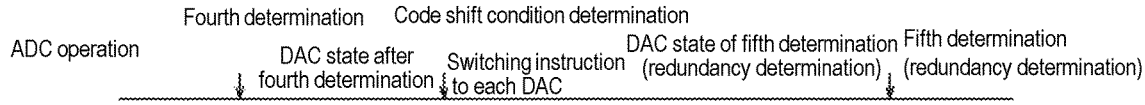
FIG. 6A is a diagram showing a change in DAC control codes according to a code shift condition determination when a shift enable signal E_SFT is H in the successive approximation AD converter shown in FIG. 3.

Specifically, as shown in FIG. 6A, when the code shift condition determination circuit 341 determines that the code shift timing signal SFT_TIM has switched from L to H, the high-order bit positive/negative shift circuit 342, the middle-order bit inverting circuit 346, and the redundant DAC control signal generation circuit 347 generates the high-order DAC control code, the middle-order DAC control code, and the redundant DAC control code according to the middle-order bit signal.

More specifically, when the middle-order bit signal is "11," the high-order bit positive/negative shift circuit 342 generates the high-order DAC control code obtained by shifting the high-order bit signal to the positive, and the middle-order bit inverting circuit 346 generates the middle-order DAC control code in which a polarity of the middle-order bit signal is inverted.

Also, when the middle-order bit signal is "00", the high-order bit positive/negative shift circuit 342 generates the high-order DAC control code obtained by shifting the high-order bit signal to the negative, and the middle-order bit inverting circuit 346 generates the middle-order DAC control code in which a polarity of the middle-order bit is inverted. Also, the redundant DAC control signal generation circuit 347 generates a redundant DAC control code obtained by adding +1 to the redundant bit.

Also, when the middle-order bit signal is neither "11" nor "00" (is "01" or "10"), only the redundant DAC control code is operated as in the case in which the code shift enable signal E_SFT is L. Specifically, the redundant DAC control signal generation circuit 347 generates a redundant DAC control code obtained by adding +1 to the redundant bit when a value (a value of the least significant bit of the middle-order bits in the present example) decided by a determination sequence (the fourth determination sequence in the present example) performed immediately before the determination of the redundant bit is "1," and generates the redundant bit signal as the redundant DAC control code without change when the value of the determination signal is "0."

[Determination (and Reflection of Determination Result on DAC Value)]

The redundant bit signal is decided by the fifth successive approximation determination made by the comparator 2. When the determination signal "1" is generated by the comparator 2, the redundant DAC control signal generation circuit 347 does not change the redundant DAC control code when the determination signal "1" is generated. When the determination signal "0" is generated, the redundant DAC control signal generation circuit 347 of the DAC control code shift circuit 34 decrements the redundant DAC control code.

<Sixth Determination Sequence>

A fifth significant bit is decided by performing the DAC setting and the determination as in the first to fourth determination sequences described above.

Thereby, the high-order DAC control code, the middle-order DAC control code and the redundant DAC control code, and the low-order DAC control code are generated by the control circuit 3, and an AD conversion result output value "17" is generated based on the values each converted by the high-order bit DAC, the middle-order bit DAC, and the low-order bit DAC.

As shown in the example of FIG. 5, in an ideal case in which there is no element variation occurring in the DA converter, an AD conversion result output value at the time when the sixth determination has ended is "17" regardless of a polarity of the code shift enable signal E_SFT and then remains the same. That is, in an ideal case in which there is no element variation occurring in the DA converter, the same result as the general redundancy determination can be obtained whether the code shift enable signal E_SFT is L or H.

Next, an operation when an element variation has occurred such that the most significant bit is changed from the ideal state will be described.

Figure 7:
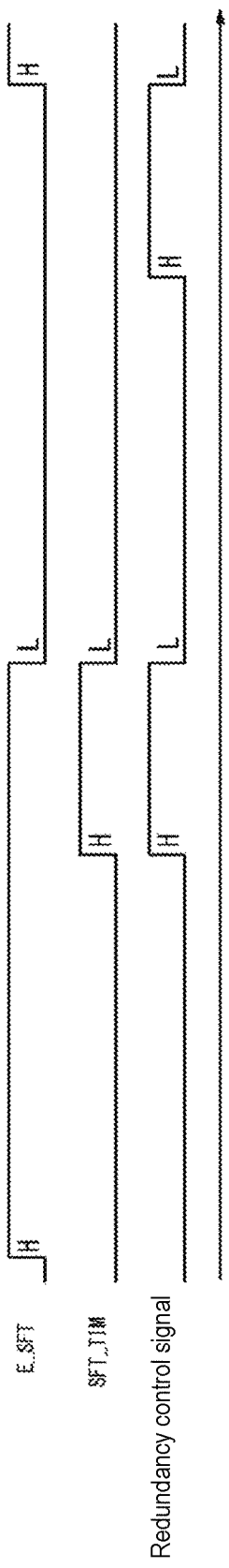
FIG. 7 is a timing chart of a successive approximation conversion when analog input values "13.9" and "14.1" are each input in a case in which an element variation has occurred in the successive approximation AD converter illustrated in FIG. 3.
Figure 8:
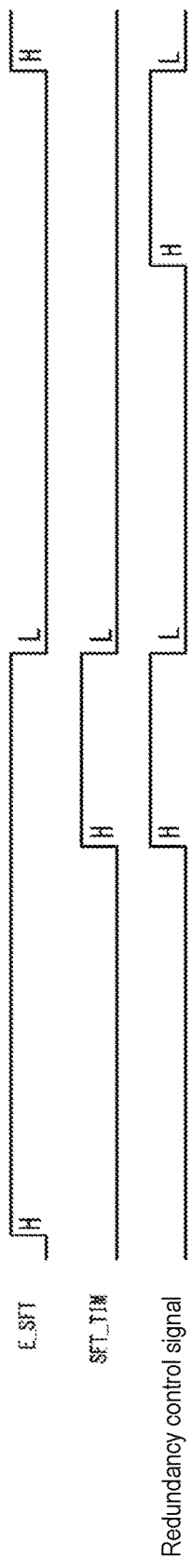
FIG. 8 is a timing chart of a successive approximation conversion when analog input values "15.9" and "16.1" are each input in a case in which an element variation has occurred in the successive approximation AD converter illustrated in FIG. 3.

Although it is ideal that a weight of the most significant bit is 16 in a 5-bit binary DAC, here, the successive approximation AD converter 100 in which an element variation has occurred such that the weight of the most significant bit is 14 instead of 16 will be described with references to FIGS. 7 and 8. FIG. 7 is a timing chart of a successive approximation conversion when analog input values "13.9" and "14.1" are each input in a case in which the element variation has occurred. FIG. 8 is a timing chart of a successive approximation conversion when analog input values "15.9" and "16.1" are each input in a case in which the element variation has occurred.

As shown in FIG. 7, when the code shift enable signal E_SFT is L, the successive approximation AD converter 100 configured as described above generates an AD conversion result output value "13" when the analog input value is "13.9," and generates an AD conversion result output value "16" when the analog input value is "14.1." As described above, the AD conversion result output value is the same as the AD conversion result output value obtained by the successive approximation conversion having general redundancy, and the AD conversion result output value does not become "14" or "15," that is, "14" and "15" are missing codes.

On the other hand, when the code shift enable signal E_SFT is H, the successive approximation AD converter 100 configured as described above generates an AD conversion result output value "13" when the analog input value is "13.9," and generates an AD conversion result output value "14" when the analog input value is "14.1." This is because the same DA converter output can be reproduced by using the redundant DAC without using an element having an error that is large enough to cause a missing code.

As shown in FIG. 8, when the code shift enable signal E_SFT is L, the successive approximation AD converter 100 configured as described above generates an AD conversion result output value "17" when the analog input value is "15.9," and generates an AD conversion result output value "18" when the analog input value is "16.1." These AD conversion result output values are the same as the AD conversion result output value obtained by the successive approximation conversion having general redundancy.

On the other hand, similarly, as shown in FIG. 8, when the code shift enable signal E_SFT is H, the successive approximation AD converter 100 configured as described above generates an AD conversion result output value "15" when the analog input value is "15.9," and generates an AD conversion result output value "18" when the analog input value is "16.1." As described above, the AD conversion result output value does not become "16" or "17," that is, "16" and "17" are missing codes.

Figure 9:
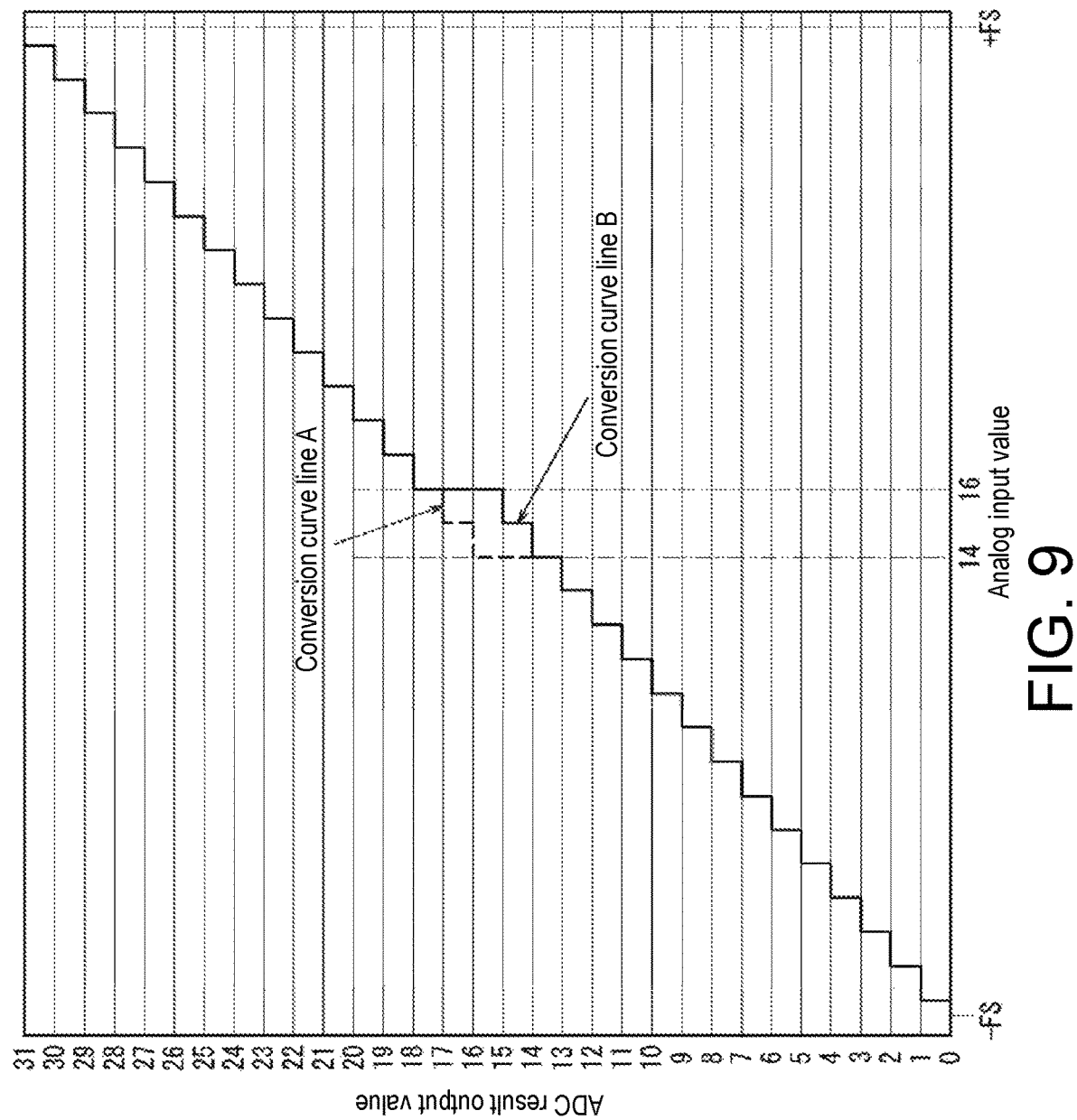
FIG. 9 is a diagram showing an AD conversion curve representing a relationship between an analog input value and an AD conversion result output value.

FIG. 9 shows an AD conversion curve when there is an element variation in the DA converter shown in FIGS. 7 and 8. The conversion curve Line A is a curve showing a relationship between the analog input value and the AD conversion result output value when the code shift enable signal E_SFT is L. In the conversion curve Line A (first conversion curve), a large code step is generated in a case of the analog input value being in the vicinity of "14" which is the example of FIG. 7. The conversion curve Line B (second conversion curve) is a curve showing a relationship between the analog input value and the AD conversion result output value when the code shift enable signal E_SFT is H. In the conversion curve Line B, a large code step is generated when in a case of the analog input value being in the vicinity of "16" which is the example of FIG. 8, while the code step is not generated when the analog input value is in the vicinity of "14."

As described above, the successive approximation AD converter 100 of the present embodiment configured as described above can shift a missing code due to an element variation. Therefore, as described above, conversion of shifting a missing code and conversion of not shifting a missing code can be switched according to the code shift enable signal E_SFT. As a result, a relationship between the analog input signal value and the AD conversion result output value approaches an ideal AD conversion curve in which the AD conversion curve Line A and the AD conversion curve Line B are averaged.

In the present embodiment, the successive approximation AD converter 100 shown in FIGS. 3 and 4 uses the redundant DAC control code but may not use the redundant DAC control code as in the successive approximation AD converter 100 shown in FIGS. 1 and 2. The successive approximation AD converter 100 shown in FIGS. 1 and 2 can also shift a missing code due to an element variation of the DA converter, and in this case also, a relationship between the analog input signal value and the AD conversion result output value can be brought close to the ideal AD conversion curve in which occurrence of a missing code is reduced by switching a conversion of shifting the missing code and a conversion of not shifting the missing code according to the code shift enable signal E_SFT.

As described above, in the present embodiment, in the redundant bit determination sequence, the code shift condition determination is performed before the redundant bit is determined, and at least one of the high-order DAC control code, the middle-order DAC control code, and the redundant DAC control code is changed under a specific condition. Thereby, a differential nonlinearity error is improved without having a circuit for generating a pseudo-random signal as in a conventional technology. That is, the differential nonlinearity error is improved while suppressing an increase in a circuit area.

Further, as shown in the timing charts of FIGS. 5, 7, and 8, the shift enable signal generation circuit 31 keeps the code shift enable signal E_SFT the same during the successive approximation conversion for one analog input value, and changes a polarity of the code shift enable signal E_SFT at the timing when sampling of the next analog input value is started. The code shift enable signal E_SFT does not need to be a pseudo-random signal, and the polarity is changed at any timing of the timing when sampling is started. Also, a frequency at which each of L and H of the code shift enable signal E_SFT is generated within a predetermined period is arbitrary. However, in view of bringing the AD conversion curve closer to the ideal curve on average, a frequency FL at which L is generated and a frequency FH at which H is generated are preferably equal.

When it is assumed that there is an extreme difference between the frequency FL at which L is generated and the frequency FH at which H is generated and, for example, a duty ratio, which is a ratio of the frequency FL to the frequency FH, is FL:FH=1:9, a ratio of the successive approximation AD converter 100 following the AD conversion curve Line A to the successive approximation AD converter 100 following the AD conversion curve Line B is 1:9. Although a temporal average value of the AD conversion result output value when each analog input value is input to the successive approximation AD converter 100 depends on the duty ratio, occurrence of missing codes can be reduced unless either the frequency FL or the frequency FH is zero.

For example, when the analog input value "14" is input at the time of the code shift enable signal E_SFT being L, the successive approximation AD converter 100 generates the AD conversion result output value "16" according to the AD conversion curve Line A. Also, when the analog input value "14" is input at the time of the code shift enable signal E_SFT being H, the AD conversion result output value "14" is generated according to the AD conversion curve Line B. Therefore, when the duty ratio is 1:1, an average value of the AD conversion result output values for the analog input value "14" is 15 (=16×0.5+14×0.5). When the duty ratio is 1:1, it is 14.2 (=16×0.1+14×0.9).

In the present embodiment, the code shift enable signal E_SFT can use a signal in which the sampling signal indicating timing of sampling is divided into halves. A configuration for dividing the sampling signal into halves can be easily realized by one flip-flop circuit. Even when the code shift enable signal E_SFT is assumed to be a signal in which the sampling signal is divided by four and is generated in the order of L, L, H, and H, effects of the present embodiment as described above can be achieved. However, since the step error is related to a frequency at which frequency modulation is performed, the frequency to be modulated falls to a low frequency region compared to the case in which the code shift enable signal E_SFT is the signal in which the sampling signal is divided into halves. Therefore, when the code shift enable signal E_SFT is the signal in which the sampling signal indicating timing of sampling is divided into halves, an error component is more likely to be dropped by a digital filter processing (for example, moving average filter) in the subsequent stage that undergoes an AD conversion.

Further, as described above, the successive approximation AD converter 100 may not include the middle-order bit DAC 7 having redundancy, middle-order bit inverting circuit 346, and redundant DAC control signal generation circuit 347 as shown in FIGS. 1 and 2. In this case, a digital value converted by the successive approximation AD converter 100 is a digital value having no redundant bit. A successive approximation AD conversion using the successive approximation AD converter 100 which converts a digital value having no redundant bit will be described with reference to FIGS. 10 and 11.

Figure 10:
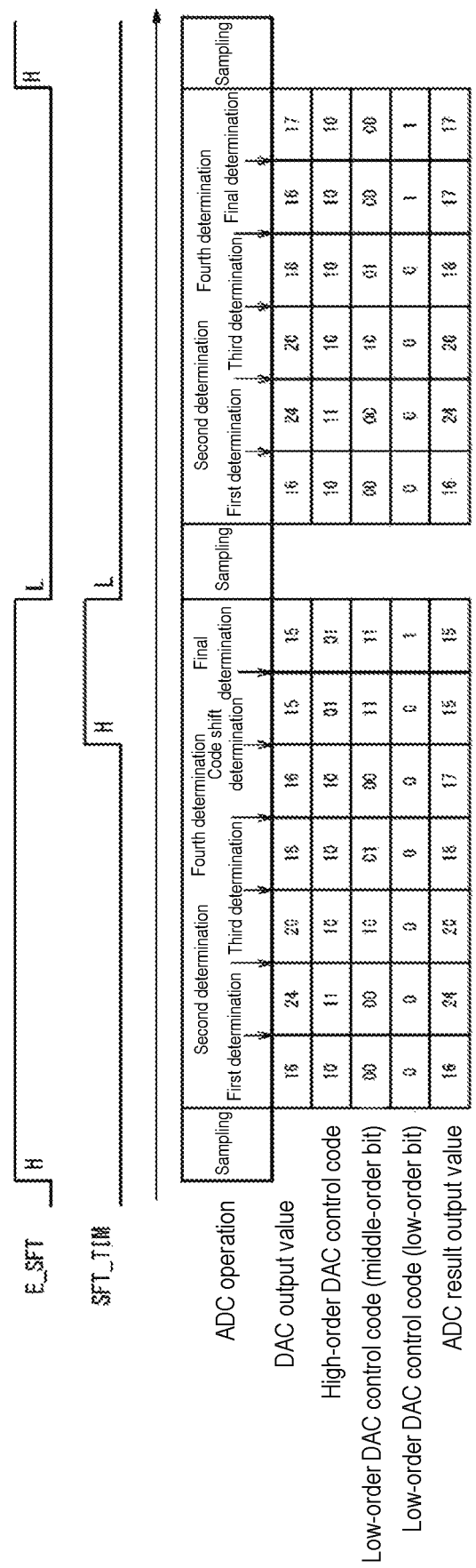
FIG. 10 is a timing chart of a successive approximation conversion in the successive approximation AD converter shown in FIG. 1.
Figure 12:
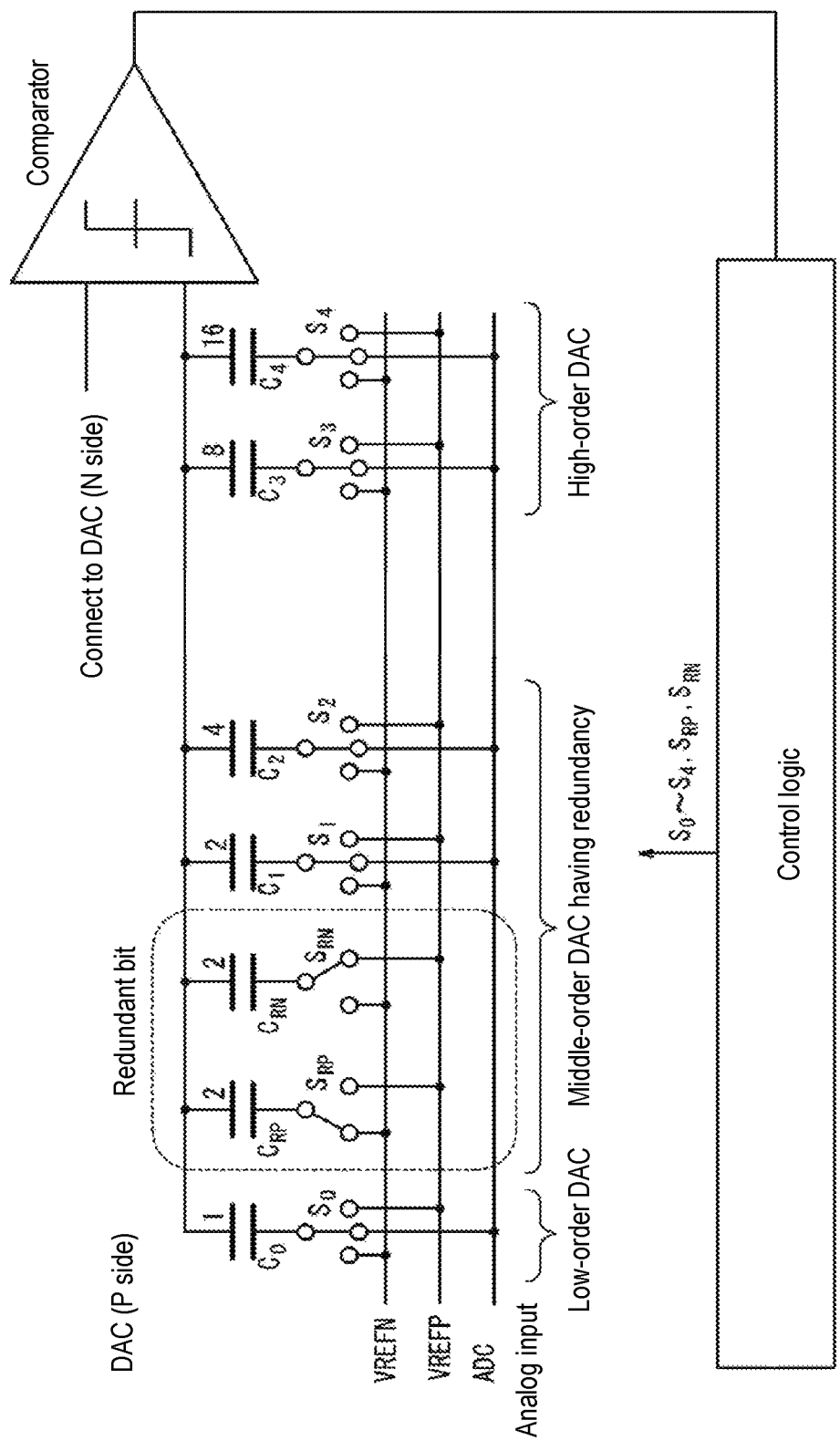
FIG. 12 is a circuit diagram of a conventional successive approximation AD converter using a 5-bit binary DAC having redundancy.
Figure 13:
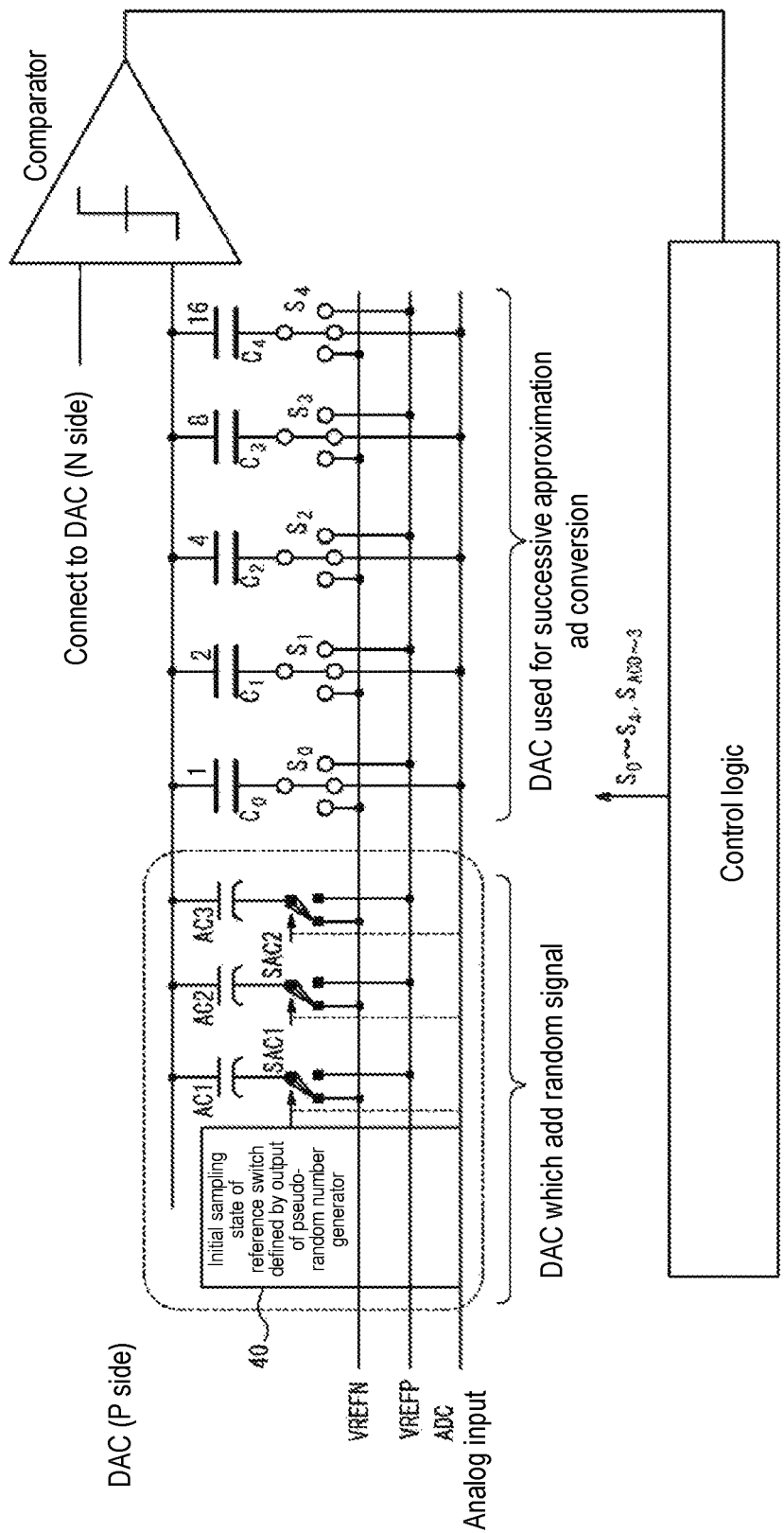
FIG. 13 is a circuit diagram of a conventional successive approximation AD converter in which a value by a pseudo-random signal generator is reflected.

As shown in FIG. 10, in a case of the analog input value being "17.5," the successive approximation AD converter 100 generates an AD conversion result output value "17" when the code shift enable signal E_SFT is L, and generates an AD conversion result output value "15" when the code shift enable signal E_SFT is H. As described above, in a case in which the digital value converted by the successive approximation AD converter 100 is a digital value having no redundant bit, when the code shift condition determination is implemented an error of two codes occurs in addition to an error due to non-ideal weighting in the high-order bit to be corrected.

In this case, as shown in FIG. 11A, in the code shift condition determination, when the middle-order bit signal is "11," the high-order bit DAC control switching circuit 342 generates a high-order DAC control code obtained by shifting the high-order bit signal to the positive, and the low-order bit DAC control switching circuit 343 generates a low-order DAC control code including a middle-order bit in which a polarity of the middle-order bit signal included in the low-order bit signal is inverted, and a low-order bit corresponding to a signal other than the middle-order bit signal included in the low-order bit signal.

Also, when the middle-order bit signal is "00," the high-order bit DAC control switching circuit 342 generates a high-order DAC control code obtained by shifting the high-order bit signal to the negative, and the low-order bit DAC control switching circuit 343 generates a low-order DAC control code including a middle-order bit in which a polarity of the middle-order bit signal included in the low-order bit signal is inverted, and a low-order bit corresponding to a signal other than the middle-order bit signal included in the low-order bit signal.

Also, when the middle-order bit signal is neither "11" nor "00" (is "01" or "10"), only the redundant DAC control code is operated as in the case in which the code shift enable signal E_SFT is L, the high-order bit DAC control switching circuit 342 generates the high-order bit signal as the high-order DAC control code without change, the low-order bit DAC control switching circuit 343 generates the low-order bit signal as the low-order DAC control code without change.

A successive approximation AD conversion method for another embodiment of the disclosure will be described. The successive approximation AD conversion method is executed using a successive approximation AD converter including a DA converter, a comparator that determines a magnitude relation between an input signal and an output signal of the DA converter, and a successive approximation register that generates a first digital signal based on a determination result. The successive approximation AD conversion method includes switching an operation selection signal from a first logic to a second logic, performing a logical operation so that a digital signal input to the DA conversion has a larger value or a smaller value than the first digital signal based on a portion of the determined first digital signal during transition when the operation selection signal has transited to the second logic, and inputting the first digital signal to the DA converter when the operation selection signal is the first logic.

In the present embodiment, the successive approximation AD conversion method further includes switching between a second state that the operation selection signal transits from the first logic to the second logic during one conversion cycle and a first state that the operation selection signal does not transit and remains unchanged from the first logic. Also, based on two or more bit values of the determined first digital signal when the operation selection signal has transited to the second logic, providing a signal obtained by incrementing the first digital signal to the DA converter when the above-described bit values are all 1, and providing a signal obtained by decrementing the first digital signal to the DA converter when the above-described bit values are all 0 are further included in the successive approximation AD conversion method.

In the present embodiment, the successive approximation AD conversion method further includes adding a redundant bit signal to a predetermined bit position of the first digital signal, performing a redundant bit determination on the redundant bit signal in a case of the first state, and performing a logical operation on the redundant bit signal in a case of the second state when the operation selection signal transits to the second logic so that a sum of the digital signal value and the redundant bit signal value when the operation selection signal is the second logic is equal to a sum of the digital signal value and the redundant bit signal value when the operation selection signal is the first logic.

(Other Configurations)

A successive approximation analog-digital (AD) converter according to the disclosure includes a comparator circuit which determines a magnitude relation between an input analog signal and a reference signal, a successive approximation register which holds a result determined by the comparator circuit and generates a first digital signal including a first bit signal and a second bit signal, an arithmetic circuit to which the first digital signal is input and which generates a second digital signal including a third bit signal and a fourth bit signal, a first bit digital-analog (DA) converter which converts the third bit signal into a first analog signal; a second bit DA converter which converts the fourth bit signal into a second analog signal, a reference signal generation circuit which generates the reference signal based on the first analog signal and the second analog signal, and a switching signal generation circuit which generates an operation selection signal switching between a first state that a logical operation is not performed and a second state that a logical operation is performed. When the operation selection signal is in the second state, after completion of determination for the determination bit signal that is a portion of the second bit signal in the first state until the operation selection signals transit to the second state, the arithmetic circuit generates the second digital signal to have a larger value or a smaller value than the input first digital signal based on any one of determination bit signals.

In the successive approximation AD converter according to the disclosure, the arithmetic circuit may generates the second digital signal to have the larger value or the smaller value than the input first digital signal when each of bit values of the determination bit signal has the same value, and the third bit signal to have the same value as the first bit signal and the fourth bit signal to have the same value as the second bit signal when each of the bit values of the determination bit signal does not have the same value.

In the successive approximation AD converter according to the disclosure, the arithmetic circuit may generate a signal obtained by incrementing the input first digital signal as the second digital signal when the bit values of the determination bit signal are all 1, and a signal obtained by decrementing the input first digital signal as the second digital signal when the bit values of the determination bit signal are all 0.

The successive approximation AD converter according to the disclosure may further comprise a redundant bit DA converter which converts a second redundant bit signal to a third analog signal. The switching signal generation circuit may generate a redundancy control signal. The successive approximation register may generate the first digital signal including the first bit signal, the second bit signal, and a first redundant bit signal. The arithmetic circuit may generate the second redundant bit signal based on the redundancy control signal and the first redundant bit signal. The reference signal generation circuit may generate the reference signal based on the first analog signal, the second analog signal, and the third analog signal.

In the successive approximation AD converter according to the disclosure, the arithmetic circuit may generate the second redundant bit signal to have the same value as the first redundant bit signal when the operation selection signal is in the second state while the redundancy control signal has a first logical value and bit values of the determination bit signal are all 1, a signal obtained by incrementing the first redundant bit signal as the second redundant bit signal when the operation selection signal is in the second state while the redundancy control signal has the first logical value and the bit values of the determination bit signal are all 0, a signal obtained by adding a least significant bit of the determination bit signal to the first redundant bit signal as the second redundant bit signal when the operation selection signal is in the second state while the redundancy control signal has the first logical value, and the bit values of the determination bit signal do not all have the same value, a signal obtained by adding a least significant bit of the determination bit signal to the first redundant bit signal as the second redundant bit signal when the redundancy control signal has the first logical value and the operation selection signal is in the first state, and the second redundant bit signal to have the same value as the first redundant bit signal when the redundancy control signal has a second logical value.

According to another embodiment of the disclosure, a successive approximation analog-digital (AD) conversion method for a successive approximation AD converter including a digital-analog (DA) converter, a comparator which determines a magnitude relation between an input signal and an output signal of the DA converter, and a successive approximation register which generates a first digital signal based on the determination result is provided. The successive approximation AD conversion method comprises switching an operation selection signal from a first logic to a second logic; performing a logical operation so that a digital signal input to the DA converter has a larger value or a smaller value than the first digital signal, when the operation selection signal has transited to the second logic, based on a portion of the determined first digital signal until transition; and inputting the first digital signal to the DA converter when the operation selection signal is the first logic.

The successive approximation AD conversion method according to the disclosure may further comprise switching between a second state that the operation selection signal transits from the first logic to the second logic during one conversion cycle and a first state that the operation selection signal does not transit and remains unchanged from the first logic.

The successive approximation AD conversion method according to the disclosure may further comprise, based on two or more bit values of the determined first digital signal when the operation selection signal has transited to the second logic, providing a signal obtained by incrementing the first digital signal to the DA converter when the bit values are all 1, and providing a signal obtained by decrementing the first digital signal to the DA converter when the bit values are all 0.

The successive approximation AD conversion method according to the disclosure may further include adding a redundant bit signal to a predetermined bit position of the first digital signal, performing a redundant bit determination on the redundant bit signal in a case of the first state, and performing the logical operation on the redundant bit signal in a case of the second state when the operation selection signal transits to the second logic so that a sum of the digital signal value and the redundant bit signal when the operation selection signal is the second logic is equal to a sum of the digital signal value and the redundant bit signal when the operation selection signal is the first logic.

According to the disclosure, it is possible to provide a successive approximation AD converter in which a differential nonlinearity error is improved with a small area even when there is a variation in an element constituting a DA converter.

While the above-described embodiments have been described as representative examples, it will be apparent to those skilled in the art that many modifications and substitutions can be made within the spirit and scope of the disclosure. Therefore, the disclosure should not be construed as being limited by the above-described embodiments, and various modifications and changes can be made without departing from the scope of the claims. For example, a plurality of constituent blocks described in the embodiments can be combined into one or one constituent block can be divided. For example, a thermometer DA converter can be used as the high-order bit DA converter and a two-stage configuration using a coupling capacitor can be employed as the low-order bit DA converter.

What is claimed is:

1. A successive approximation analog-digital (AD) converter, comprising:
    a comparator circuit which determines a magnitude relation between an input analog signal and a reference signal;
    a successive approximation register which holds a result determined by the comparator circuit and generates a first digital signal including a first bit signal and a second bit signal;
    an arithmetic circuit to which the first digital signal is input and which generates a second digital signal including a third bit signal and a fourth bit signal;
    a first bit digital-analog (DA) converter which converts the third bit signal into a first analog signal;
    a second bit DA converter which converts the fourth bit signal into a second analog signal;
    a reference signal generation circuit which generates the reference signal based on the first analog signal and the second analog signal; and
    a switching signal generation circuit which generates an operation selection signal switching between a first state that a logical operation is not performed and a second state that the logical operation is performed,
    wherein when the operation selection signal is in the second state, after completion of determination for the determination bit signal that is a portion of the second bit signal in the first state until the operation selection signals transit to the second state, the arithmetic circuit generates the second digital signal to have a larger value or a smaller value than the input first digital signal based on any one of determination bit signals.

2. The successive approximation AD converter according to claim 1, wherein the arithmetic circuit generates:
    the second digital signal to have the larger value or the smaller value than the input first digital signal when each of bit values of the determination bit signal has the same value, and
    the third bit signal to have the same value as the first bit signal and the fourth bit signal to have the same value as the second bit signal when each of the bit values of the determination bit signal does not have the same value.

3. The successive approximation AD converter according to claim 1, wherein the arithmetic circuit generates:
    a signal obtained by incrementing the input first digital signal as the second digital signal when the bit values of the determination bit signal are all 1, and
    a signal obtained by decrementing the input first digital signal as the second digital signal when the bit values of the determination bit signal are all 0.

4. The successive approximation AD converter according to claim 1, further comprising:
    a redundant bit DA converter which converts a second redundant bit signal to a third analog signal,
    wherein the switching signal generation circuit generates a redundancy control signal,
    the successive approximation register generates the first digital signal including the first bit signal, the second bit signal, and a first redundant bit signal,
    the arithmetic circuit generates the second redundant bit signal based on the redundancy control signal and the first redundant bit signal, and
    the reference signal generation circuit generates the reference signal based on the first analog signal, the second analog signal, and the third analog signal.

5. The successive approximation AD converter according to claim 4, wherein the arithmetic circuit generates:
    the second redundant bit signal to have the same value as the first redundant bit signal when the operation selection signal is in the second state while the redundancy control signal has a first logical value and bit values of the determination bit signal are all 1,
    a signal obtained by incrementing the first redundant bit signal as the second redundant bit signal when the operation selection signal is in the second state while the redundancy control signal has the first logical value and the bit values of the determination bit signal are all 0,
    a signal obtained by adding a least significant bit of the determination bit signal to the first redundant bit signal as the second redundant bit signal when the operation selection signal is in the second state while the redundancy control signal has the first logical value, and the bit values of the determination bit signal do not all have the same value,
    a signal obtained by adding the least significant bit of the determination bit signal to the first redundant bit signal as the second redundant bit signal when the redundancy control signal has the first logical value and the operation selection signal is in the first state, and
    the second redundant bit signal to have the same value as the first redundant bit signal when the redundancy control signal has a second logical value.

6. A successive approximation analog-digital (AD) conversion method for a successive approximation AD converter comprising:
    a digital-analog (DA) converter:
    a comparator which determines a magnitude relation between an input signal and an output signal of the DA converter; and
    a successive approximation register which generates a first digital signal based on a determination result,
    the successive approximation AD conversion method comprising:
    switching an operation selection signal from a first logic to a second logic;

performing a logical operation so that a digital signal input to the DA converter has a larger value or a smaller value than the first digital signal, when the operation selection signal has transited to the second logic, based on a portion of the determined first digital signal until transition;

inputting the first digital signal to the DA converter when the operation selection signal is the first logic; and switching between a second state that the operation selection signal transits from the first logic to the second logic during one conversion cycle and a first state that the operation selection signal does not transit and remains unchanged from the first logic.

7. The successive approximation AD conversion method according to claim 6, further comprising:

based on two or more bit values of the determined first digital signal when the operation selection signal has transited to the second logic, providing a signal obtained by incrementing the first digital signal to the DA converter when the bit values are all 1, and providing a signal obtained by decrementing the first digital signal to the DA converter when the bit values are all 0.

8. The successive approximation AD conversion method according to claim 7, further comprising:

adding a redundant bit signal to a predetermined bit position of the first digital signal, performing a redundant bit determination on the redundant bit signal in a case of the first state, and performing the logical operation on the redundant bit signal in a case of the second state when the operation selection signal transits to the second logic so that a sum of the digital signal value and the redundant bit signal when the operation selection signal is the second logic is equal to a sum of the digital signal value and the redundant bit signal when the operation selection signal is the first logic.

* * * * *